(12) United States Patent
Kumano

(10) Patent No.: US 10,361,231 B2
(45) Date of Patent: Jul. 23, 2019

(54) IMAGE CAPTURING APPARATUS, MANUFACTURING METHOD THEREOF, AND CAMERA

(71) Applicant: CANON KABUSHIKI KAISHA, Tokyo (JP)

(72) Inventor: Hideomi Kumano, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/442,940

(22) Filed: Feb. 27, 2017

(65) Prior Publication Data

US 2017/0170230 A1    Jun. 15, 2017

Related U.S. Application Data

(63) Continuation of application No. 14/049,409, filed on Oct. 9, 2013, now Pat. No. 9,659,991.

(30) Foreign Application Priority Data

Oct. 22, 2012 (JP) ................. 2012-233300
Oct. 22, 2012 (JP) ................. 2012-233301

(51) Int. Cl.
*H01L 27/146* (2006.01)
*H04N 5/225* (2006.01)

(52) U.S. Cl.
CPC .... *H01L 27/14629* (2013.01); *H01L 27/1462* (2013.01); *H01L 27/1464* (2013.01);
(Continued)

(58) Field of Classification Search
CPC ......... H01L 27/14625; H01L 27/14629; H01L 27/14687; H01L 27/14689; H01L 27/14685
See application file for complete search history.

(56) References Cited

U.S. PATENT DOCUMENTS 6,989,602 B1    1/2006  Lytle
7,920,192 B2    4/2011  Watanabe et al.
(Continued)

FOREIGN PATENT DOCUMENTS

CN    101197387 A    6/2008
JP    H02-264473 A   10/1990
(Continued)

OTHER PUBLICATIONS

Office Action dated Mar. 17, 2017, in Japanese Patent Application No. 2012-233301.

(Continued)

*Primary Examiner* — Laura M Menz
*Assistant Examiner* — Candice Chan
(74) *Attorney, Agent, or Firm* — Venable LLP

(57) ABSTRACT

A back-side illumination image capturing apparatus includes a semiconductor substrate having a first surface for receiving incident light and a second surface located on the opposite side as the first surface, and including a photoelectric conversion portion, and a gate electrode disposed above the second surface. The apparatus further includes a first insulating layer disposed above the second surface of the semiconductor substrate, an interlayer insulation film disposed on the first insulating layer, a contact plug connected to the gate electrode, and a light-cutting portion for cutting light, of the incident light, that has passed through the photoelectric conversion portion. The light-cutting portion passes through at least part of the interlayer insulation film. The first insulating layer is located between the light-cutting portion and the semiconductor substrate.

17 Claims, 14 Drawing Sheets

(52) U.S. Cl.
CPC .. *H01L 27/14636* (2013.01); *H01L 27/14641* (2013.01); *H01L 27/14685* (2013.01); *H04N 5/2251* (2013.01); *H04N 5/2252* (2013.01); *H04N 5/2256* (2013.01); *H01L 27/14643* (2013.01)

(56) References Cited

U.S. PATENT DOCUMENTS

| | | |
|---|---|---|
| 7,960,197 B2 | 6/2011 | Akiyama |
| 8,039,914 B2 | 10/2011 | Akiyama |
| 8,405,180 B2 | 3/2013 | Akiyama |
| 8,411,187 B2 | 4/2013 | Watanabe et al. |
| 8,436,407 B2 | 5/2013 | Furuichi et al. |
| 8,471,196 B2 | 6/2013 | Kumano |
| 8,987,852 B2 | 3/2015 | Okabe et al. |
| 9,373,658 B2 | 6/2016 | Okabe et al. |
| 2007/0040102 A1 | 2/2007 | Mouli |
| 2008/0135963 A1 | 6/2008 | Akiyama |
| 2008/0251874 A1 | 10/2008 | Ishibe |
| 2010/0203665 A1 | 8/2010 | Park |
| 2011/0003426 A1 | 1/2011 | Watanabe et al. |
| 2015/0325610 A1 | 11/2015 | Watanabe et al. |

FOREIGN PATENT DOCUMENTS

| | | |
|---|---|---|
| JP | H03-257868 A | 11/1991 |
| JP | H07-066178 A | 3/1995 |
| JP | H09-129730 A | 5/1997 |
| JP | 2006-190766 A | 7/2006 |
| JP | 2008-041726 A | 2/2008 |
| JP | 2008-147333 A | 6/2008 |
| JP | 2008-235689 A | 10/2008 |
| JP | 2009-027004 A | 2/2009 |
| JP | 2010-177704 A | 8/2010 |
| JP | 2011-124501 A | 6/2011 |
| JP | 2012-182426 A | 9/2012 |

OTHER PUBLICATIONS

Office Action dated Oct. 29, 2015, in Chinese Patent Application No. 201310496053.2.
U.S. Appl. No. 14/046,474, filed Oct. 4, 2013.

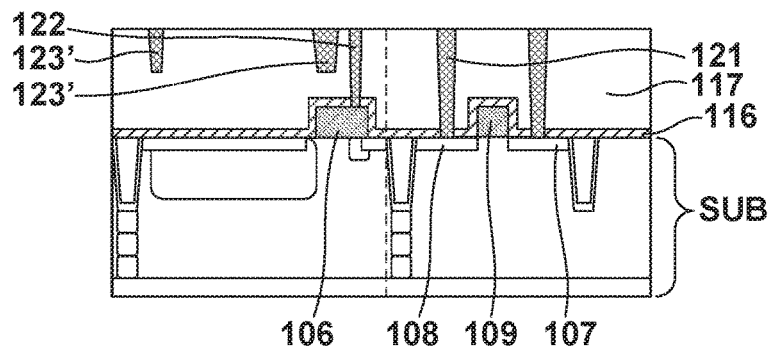
F I G. 12A
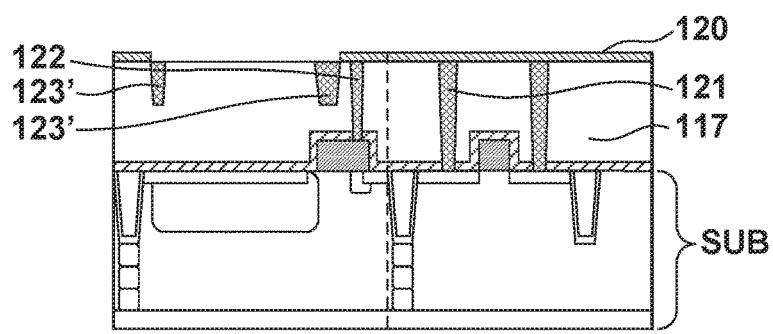
F I G. 12B
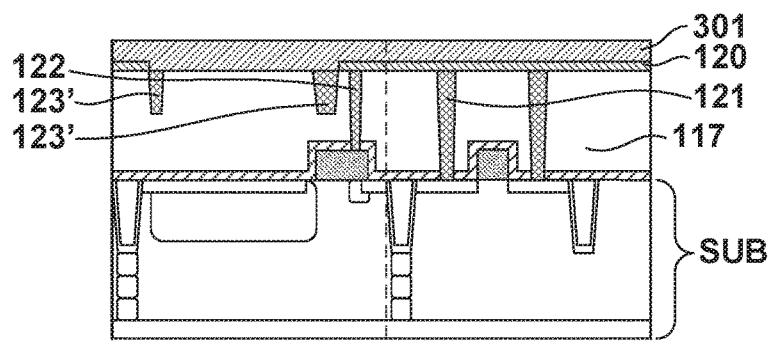
F I G. 12C
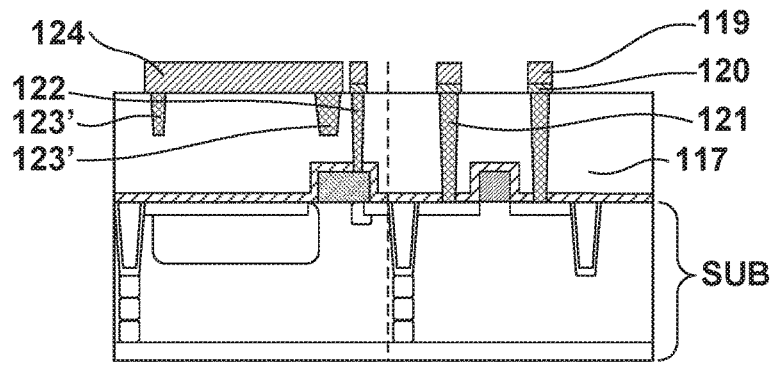
F I G. 12D

IMAGE CAPTURING APPARATUS, MANUFACTURING METHOD THEREOF, AND CAMERA

This is a continuation of U.S. patent application Ser. No. 14/049,409, filed Oct. 9, 2013.

BACKGROUND OF THE INVENTION

Field of the Invention

The present disclosure relates to image capturing apparatuses, manufacturing methods thereof, and cameras.

Description of the Related Art

A photoelectric conversion portion is typically thinner in back-side illumination image capturing apparatuses than in front-side illumination image capturing apparatuses, and thus light incident on the image capturing apparatus can be insufficiently absorbed by the photoelectric conversion portion, resulting in some of that light passing through the photoelectric conversion portion. Mixing of colors can occur between pixels in the case where the light that has passed through the photoelectric conversion portion is reflected by a wiring layer or the like and reaches the photoelectric conversion portions of other pixels. In order to prevent the mixture of colors, Japanese Patent Laid-Open No. 2010-177704 proposes a structure in which a cylindrical metal layer is disposed above the photoelectric conversion portion with a gate insulation film provided therebetween. Light that has passed through the photoelectric conversion portion and advanced to an inner side of the cylindrical metal layer is reflected by the side surfaces of the metal layer.

SUMMARY OF THE INVENTION

According to an aspect of the present invention, a back-side illumination image capturing apparatus comprises a semiconductor substrate having a first surface for receiving incident light and a second surface located on the opposite side as the first surface, and including a photoelectric conversion portion, and a gate electrode disposed above the second surface, a first insulating layer disposed above the second surface of the semiconductor substrate, an interlayer insulation film disposed on the first insulating layer, a contact plug connected to the gate electrode, and a light-cutting portion for cutting light, of the incident light, that has passed through the photoelectric conversion portion. The light-cutting portion passes through at least part of the interlayer insulation film. The first insulating layer is located between the light-cutting portion and the semiconductor substrate.

According to another aspect of the present invention, a back-side illumination image capturing apparatus comprises a semiconductor substrate having a first surface for receiving incident light and a second surface located on the opposite side as the first surface, and including a photoelectric conversion portion, and a gate electrode located above the second surface, an interlayer insulation film disposed above the second surface of the semiconductor substrate, a contact plug connected to the gate electrode, and a light-cutting portion for cutting light, of the incident light, that has passed through the photoelectric conversion portion. Part of the interlayer insulation film is located between the light-cutting portion and the semiconductor substrate.

According to yet another aspect of the present invention, a method for manufacturing a back-side illumination image capturing apparatus is provided. The image capturing apparatus includes a semiconductor substrate having a first surface for receiving incident light and a second surface located on the opposite side as the first surface, and including a photoelectric conversion portion, and a gate electrode located above the second surface, a contact plug connected to the gate electrode, and a light-cutting portion for cutting light, of the incident light, that has passed through the photoelectric conversion portion. The method comprises forming a first insulating layer above the second surface of the semiconductor substrate and forming an interlayer insulation film above the first insulating layer, forming a first opening for forming the contact plug by etching away part of the interlayer insulation film and part of the first insulating layer, and forming a second opening for forming the light-cutting portion by etching away another part of the interlayer insulation film. In the step of forming the first opening, the first opening reaches the gate electrode. In the step of forming the second opening, at least part of the first insulating layer is left between the second opening and the semiconductor substrate.

Further features of the present invention will become apparent from the following description of exemplary embodiments (with reference to the attached drawings).

BRIEF DESCRIPTION OF THE DRAWINGS

FIGS. 11A to 12D are diagrams illustrating an example of a method for manufacturing the image capturing apparatus shown in FIGS. 10A and 10B.

DESCRIPTION OF THE EMBODIMENTS

Figure 1A:
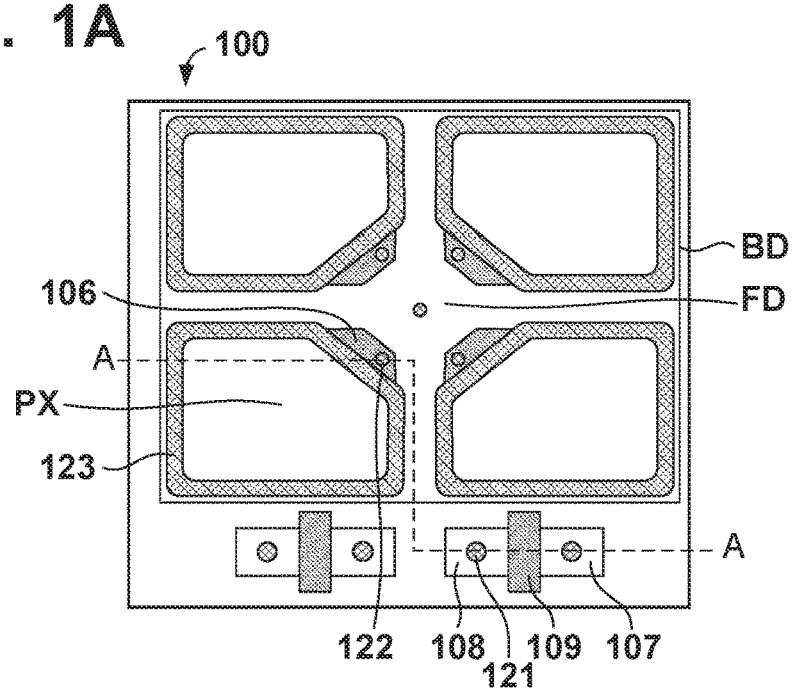
FIGS. 1A and 1B are diagrams illustrating an example of the structure of an image capturing apparatus according to some embodiments.

Several embodiments will be described hereinafter with reference to the appended drawings. Elements that are the same throughout the embodiments will be assigned the same reference numerals, and redundant descriptions thereof will be omitted. Note that various embodiments can be altered or combined as appropriate.

Japanese Patent Laid-Open No. 2010-177704 discloses forming openings in an interlayer insulation film provided upon a gate insulation film and embedding the metal layer in the openings in order to achieve the aforementioned configuration. However, this document does not discuss a specific method for forming the openings in the interlayer insulation film.

The inventors of the present invention realized that openings can be formed in an interlayer insulation film through etching. Furthermore, the inventors of the present invention realized that the following issues can arise when forming openings through etching. For example, as image capturing apparatuses have become smaller, gate insulation films have become thinner. Accordingly, there is a risk that a gate insulation film will fail to function as an etching stopper layer, resulting in the photoelectric conversion portion located below the gate insulation film being exposed during etching carried out to form the stated openings. When the photoelectric conversion portion is exposed, metal from the metal layer can contaminate the photoelectric conversion portion, resulting in dark current. This problem is particularly prevalent in cases such as where the interlayer insulation film and the gate insulation film are formed of the same material and there is no difference or only a small difference between the etching rates of the two films. Accordingly, some embodiments of the present invention provide techniques for reducing damage to a photoelectric conversion portion caused when etching an interlayer insulation film.

Figure 1B:
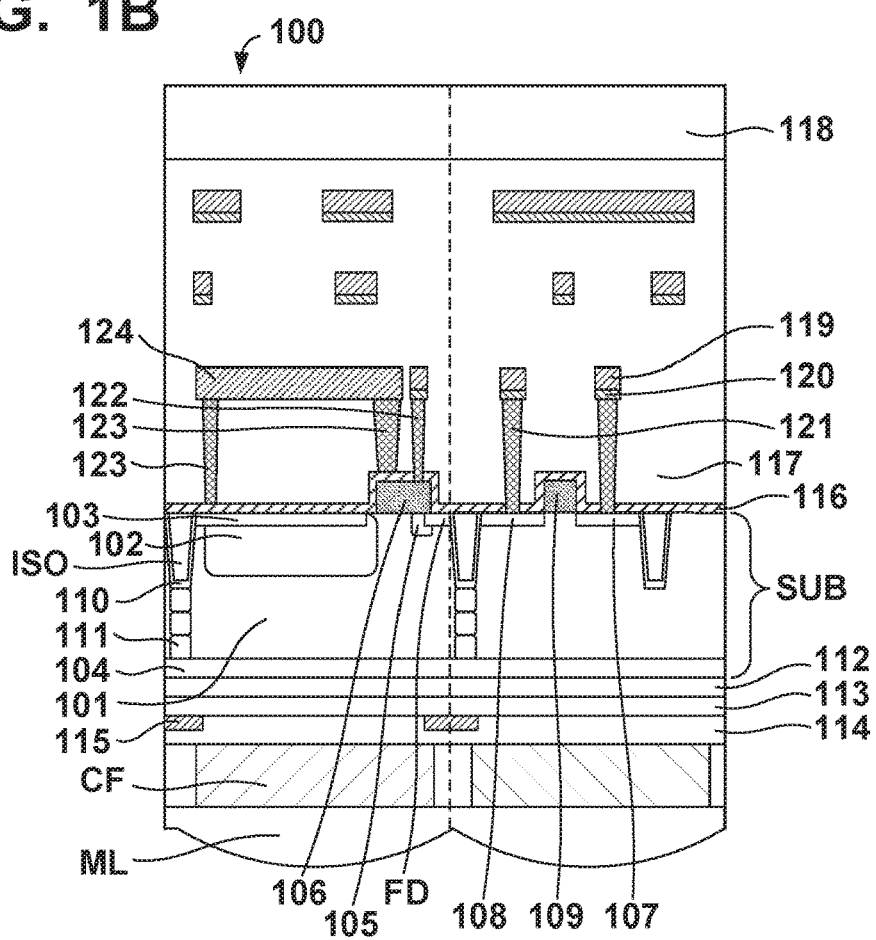

The structure of an image capturing apparatus 100 according to some embodiments will be described with reference to FIGS. 1A and 1B. FIG. 1A is a plan view illustrating part of the image capturing apparatus 100, whereas FIG. 1B illustrates a cross-sectional view taken along the A-A line in FIG. 1A. Some constituent elements have been omitted from the plan view in FIG. 1A in order to make the illustrations clearer. As indicated in FIG. 1B, the image capturing apparatus 100 is a back-side illumination image capturing apparatus 100, and the image capturing apparatus 100 can receive incident light from below, in the depiction in FIG. 1B, and convert that light into a signal. However, some embodiments are not limited to the configuration of the image capturing apparatus shown in FIGS. 1A and 1B, and can be applied in any configuration as long as the image capturing apparatus is a back-side illumination type.

The image capturing apparatus 100 includes a plurality of pixels disposed in array form, and four of those pixels PX are illustrated in FIG. 1A. Each pixel PX can include an N-type semiconductor region 101 formed in a semiconductor substrate SUB, an N-type semiconductor region 102 having a higher impurity concentration than the semiconductor region 101, and a P-type semiconductor region 103 formed on a surface of the semiconductor substrate SUB. Furthermore, a P-type semiconductor region 104 can be provided on the surface of the semiconductor substrate SUB on a light-incident side thereof, and the semiconductor regions 101 to 104 can function as a photoelectric conversion portion. For example, the semiconductor regions 101 to 104 can configure a photodiode. The semiconductor region 102 can function as an accumulation region that accumulates electrons generated by the photoelectric conversion portion.

The semiconductor substrate SUB includes a floating diffusion FD, which is an N-type semiconductor region, in the center of the four pixels PX. The floating diffusion FD is shared by the four pixels PX. Each pixel PX has a transfer gate 106 that is positioned so as to cover a region between the floating diffusion FD and the semiconductor region 102, and a P-type barrier region 105 is provided below the transfer gate 106. The transfer gate 106 is formed of polysilicon, for example, and configures part of a transfer transistor that transfers a charge.

In addition to the photoelectric conversion portion, each pixel PX includes a plurality of transistors, and the right side of FIG. 1B illustrates the cross-sectional structure of a single transistor. This transistor can be a reset transistor for resetting the photoelectric conversion portion, an amplifying transistor for amplifying the potential of the floating diffusion FD, a readout transistor for reading out a pixel signal to a signal line, or the like. The transistor can have P-type semiconductor regions 107 and 108 formed on the semiconductor substrate SUB and a gate 109 formed in a position so that the gate 109 covers a region between the semiconductor regions 107 and 108. Although not illustrated, a gate insulation film is disposed below the transfer gate 106 and the gate 109. The semiconductor substrate SUB can have an element isolation region ISO such as shallow trench isolation (STI), a P-type channel stop region 110, and a P-type isolation region 111 in the periphery of the transistors, the photoelectric conversion portion, and so on. The solid line BD in FIG. 1A illustrates a border between the photoelectric conversion portions of the pixels PX and the element isolation region ISO disposed in the periphery thereof.

The image capturing apparatus 100 can further include an antireflection layer 112, an interlayer insulation film 113, a planarizing layer 114, a color filter CF, and microlenses ML, in that order on the light-incident side of the semiconductor substrate SUB (the bottom, in FIG. 1B). A light-shielding layer 115 is formed upon the planarizing layer 114. The light-shielding layer 115 can have a grid shape that covers the borders with adjacent pixels PX.

The image capturing apparatus 100 can further include an insulating layer 116 (a first insulating layer), an interlayer insulation film 117, and a supporting substrate 118, in that order on the opposite side as the light-incident side of the semiconductor substrate SUB (the top, in FIG. 1B). The insulating layer 116 may contain a different material than the interlayer insulation film 117. The insulating layer 116 can have a layered structure including, for example, a silicon nitride film and a silicon oxide film serving as layers. The interlayer insulation film 117, meanwhile, can be formed of, for example, silicon oxide. As will be described later, the insulating layer 116 functions as an etching stopper layer when etching the interlayer insulation film 117. The image capturing apparatus 100 can include a plurality of wiring layers within the interlayer insulation film 117. In other words, the interlayer insulation film 117 is an insulation film disposed between the wiring layers and the semiconductor substrate SUB. Each wiring layer can include a wiring pattern 119 formed of aluminum, copper, or the like, and a barrier metal 120 formed of TiN/Ti or the like. The semiconductor regions 107 and 108 that configure part of the transistor are connected to the wiring layers by a contact plug 121 formed of tungsten or the like. In addition, the transfer gate 106, the gate 109, and so on are connected to the wiring layers by a contact plug 122 formed of tungsten or the like. The contact plugs 121 and 122 pass through the interlayer insulation film 117 and the insulating layer 116.

The image capturing apparatus 100 can further include a light-cutting portion 123 and a reflective layer 124 within the interlayer insulation film 117. The light-cutting portion 123 is formed of a metal such as tungsten, copper, or the like, and prevents light that has passed through the photoelectric conversion portion from reaching the photoelectric conversion portions of other pixels by cutting that light. In this embodiment, the light-cutting portion 123 is configured of a material having a lower transmissibility than the interlayer insulation film 117. However, it is not necessary for all of the light to be cut by the light-cutting portion 123. The reflective layer 124 is formed of a metal such as aluminum, copper, or the like, and returns light that has passed through the photoelectric conversion portion to the photoelectric conversion portion by reflecting that light. In some embodiments, the light-cutting portion 123 is cylindrical in shape, and the reflective layer 124 is formed in a shape/position so as to serve as a cover for the cylindrical light-cutting portion 123. In other words, the reflective layer 124 has a pillar-like shape, and an upper surface of the light-cutting portion 123 makes contact with a base surface of the reflective layer 124. The reflective layer 124 may configure part of the wiring pattern 119. In other words, the configuration may be such that when the image capturing apparatus 100 operates, a current flows through the reflective layer 124, a voltage is applied to the reflective layer 124, or the like. Although the light-cutting portion 123 passes through the interlayer insulation film 117, the light-cutting portion 123 does not pass through the insulating layer 116. In other words, the insulating layer 116 is disposed between the light-cutting portion 123 and the semiconductor substrate SUB. The interlayer insulation film 117 may include a plurality of insulating layers. Here, the light-cutting portion 123 may pass through some of the insulating layers in the interlayer insulation film 117, as shown in FIG. 1B, or may pass through the entirety of the interlayer insulation film 117. Furthermore, the light-cutting portion 123 is not limited to a cylindrical shape. For example, a plurality of light-cutting portions 123 may be disposed intermittently so as to enclose a single photoelectric conversion portion.

Figure 2A:
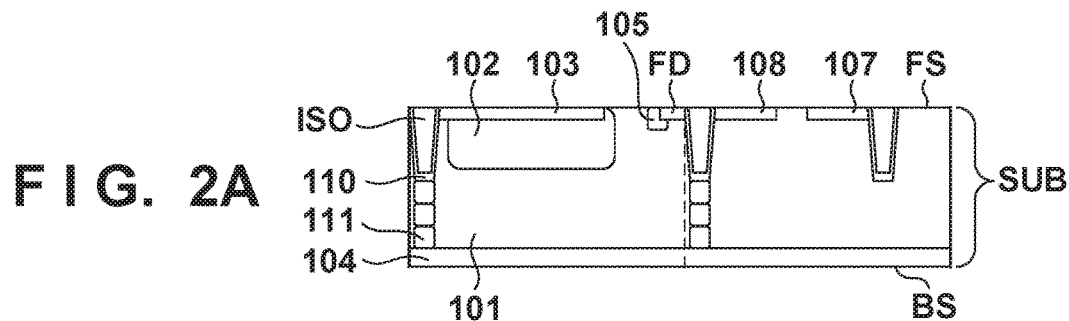
FIGS. 2A to 3D are diagrams illustrating an example of a method for manufacturing the image capturing apparatus shown in FIGS. 1A and 1B.

An example of a method for manufacturing the image capturing apparatus 100 shown in FIGS. 1A and 1B will now be described with reference to FIGS. 2A to 2D and 3A to 3D. FIGS. 2A to 2D and 3A to 3D are cross-sectional views from the same position as in FIG. 1B. First, as shown in FIG. 2A, the semiconductor substrate SUB, formed having the structure illustrated in FIGS. 1A and 1B, is prepared. The semiconductor substrate SUB can be formed using an existing method, and thus descriptions thereof will be omitted. The semiconductor substrate SUB has a front surface FS (a first surface) and a back surface BS (a second surface) on the opposite side thereof (that is, on the opposite side as the first surface). Light incident on the image capturing apparatus 100 is incident on the photoelectric conversion portion from the back surface BS of the semiconductor substrate SUB.

Figure 2B:
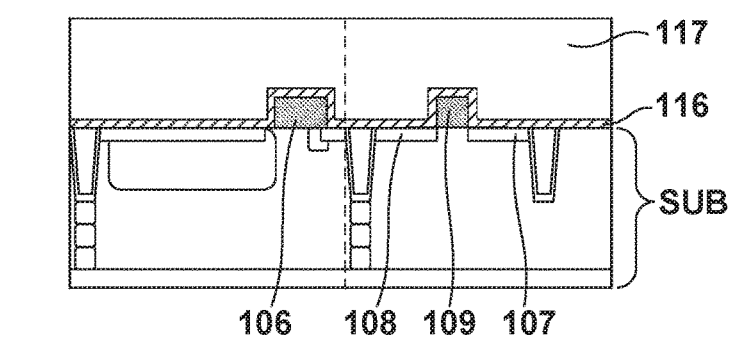

Next, as shown in FIG. 2B, the transfer gate 106 and the gate 109 are formed using polysilicon or the like. Although not illustrated, a gate insulation film is formed below the transfer gate 106 and the gate 109. Thereafter, the insulating layer 116 is deposited on the front surface FS (on the second surface) of the semiconductor substrate SUB over the transfer gate 106 and the gate 109 through plasma CVD. The insulating layer 116 can have a layered structure including, for example, a silicon nitride film and a silicon oxide film serving as layers. The insulating layer 116 may be formed at a thickness that enables the insulating layer 116 to function as an antireflection layer. Thereafter, the interlayer insulation film 117 is formed by depositing silicon oxide on the insulating layer 116 through plasma CVD, and the upper surface of the interlayer insulation film 117 is then planarized through CMP.

Figure 2C:
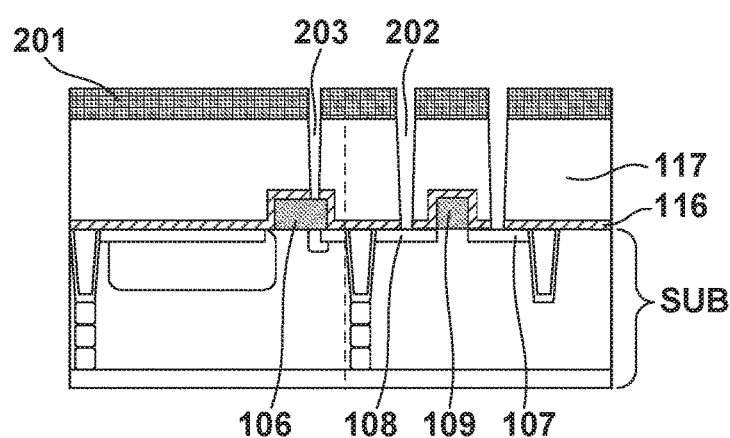

Next, as shown in FIG. 2C, a mask pattern 201 is formed on the interlayer insulation film 117. The mask pattern 201 exposes positions in which contact plugs connected to circuit elements formed in the semiconductor substrate SUB, such as the contact plugs 121 and 122, are to be formed, and covers the other areas. Etching is then carried out over the mask pattern 201, forming openings 202 and 203 by removing part of the interlayer insulation film 117 and part of the insulating layer 116. The opening 202 reaches the semiconductor region 108, and part of the upper surface of the semiconductor region 108 is exposed through the opening 202. This exposed area serves as a connection surface with the contact plug 121. The opening 203 (a first opening) reaches the transfer gate 106, and part of the upper surface of the transfer gate 106 is exposed through the opening 203. This exposed area serves as a connection surface with the contact plug 122. As a first step, etching may be carried out using a method that is highly selective of the interlayer insulation film 117 over the insulating layer 116 (that is, that etches the interlayer insulation film 117 at a higher etching rate), and then, as a second step, the etching may be carried out under different conditions.

Figure 2D:
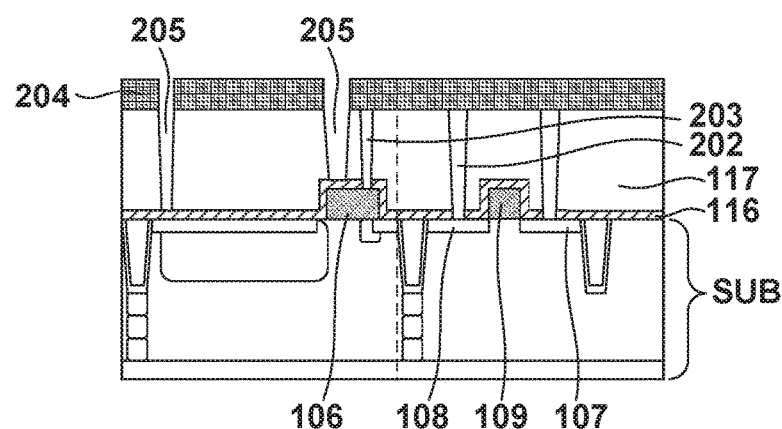

Next, as shown in FIG. 2D, the mask pattern 201 is removed, and a mask pattern 204 is formed on the interlayer insulation film 117. The mask pattern 204 exposes positions where the light-cutting portion 123 shown in FIGS. 1A and 1B is to be formed, and covers the other areas. Etching is then carried out over the mask pattern 204, forming an opening 205 by removing part of the interlayer insulation film 117. Although the opening 205 (a second opening) reaches the insulating layer 116, the insulating layer 116 functions as an etching stopper layer during this etching, and thus the opening 205 does not reach the semiconductor substrate SUB. For example, if, in the etching carried out at this time, the etching rate of the insulating layer 116 is higher than the etching rate of the interlayer insulation film 117, the insulating layer 116 can function as an etching stopper layer. Accordingly, a combination of an etching method that achieves this etching rate relationship and materials for the interlayer insulation film 117 and the insulating layer 116 may be selected as appropriate. Alternatively, using an insulation film that is thicker than the gate insulation film as the insulating layer 116 can enable the insulating layer 116 to function as an etching stopper layer. In this case, the etching method, the etching rates, and so on are not particularly limited.

Figure 3A:
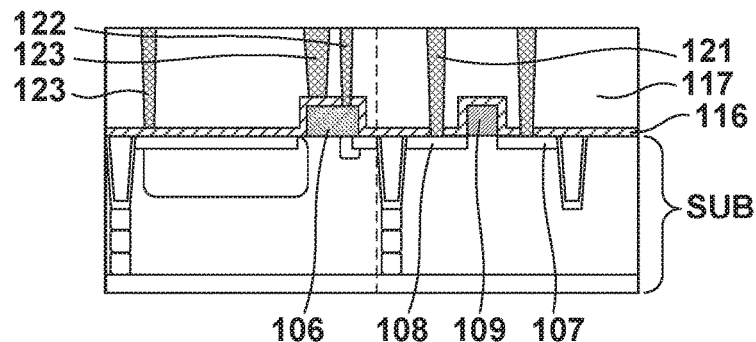

Next, as shown in FIG. 3A, tungsten is embedded in the openings 202, 203, and 205 after the mask pattern 204 has been removed. As a result, the contact plug 121 is formed in the opening 202, the contact plug 122 is formed an opening 203, and the light-cutting portion 123 is formed in the opening 205.

Figure 3B:
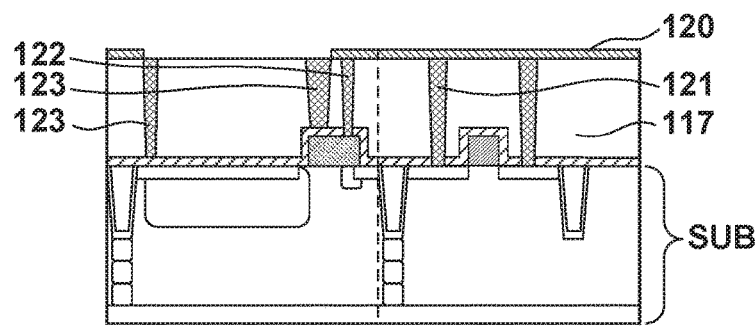
Figure 3C:
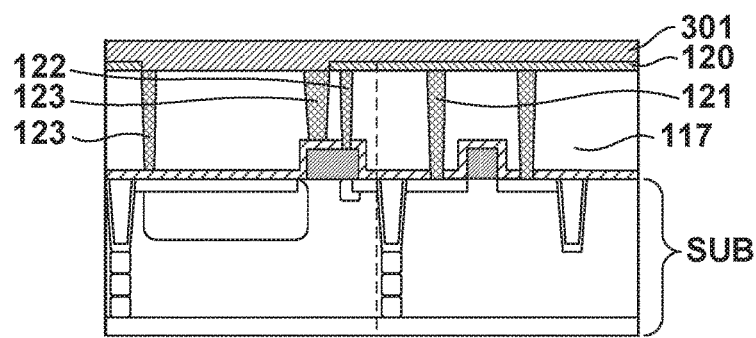
Figure 3D:
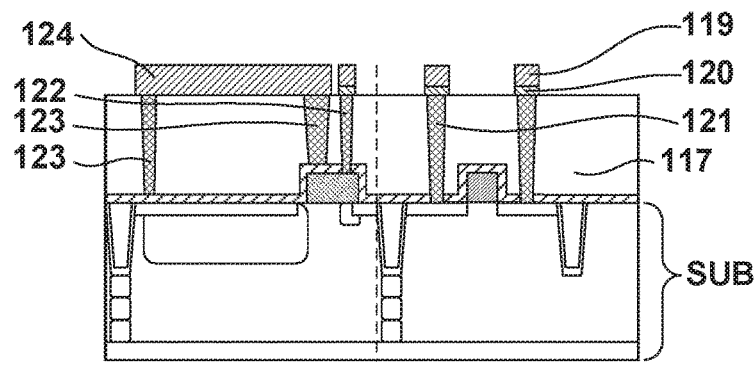
Figure 4A:
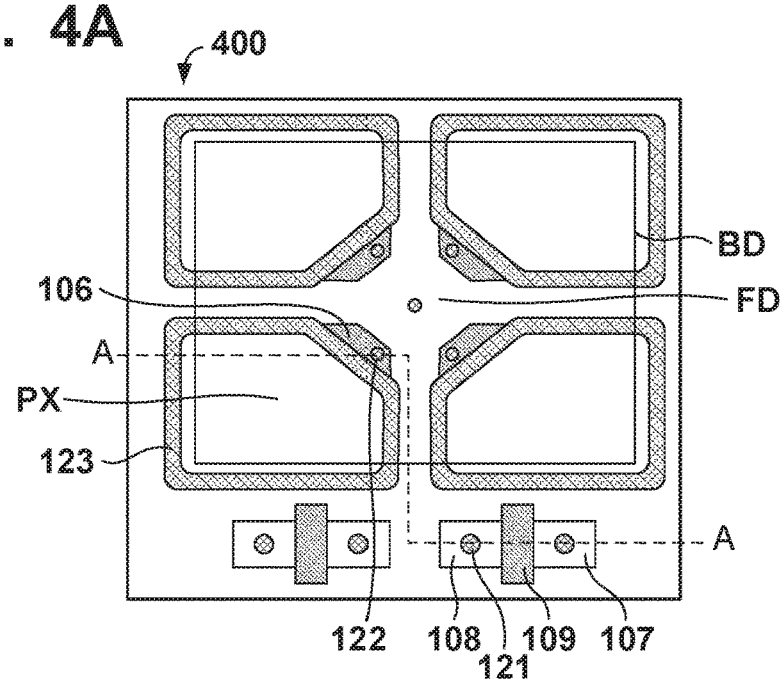
FIGS. 4A and 4B are diagrams illustrating a variation on the image capturing apparatus shown in FIGS. 1A and 1B.
Figure 4B:
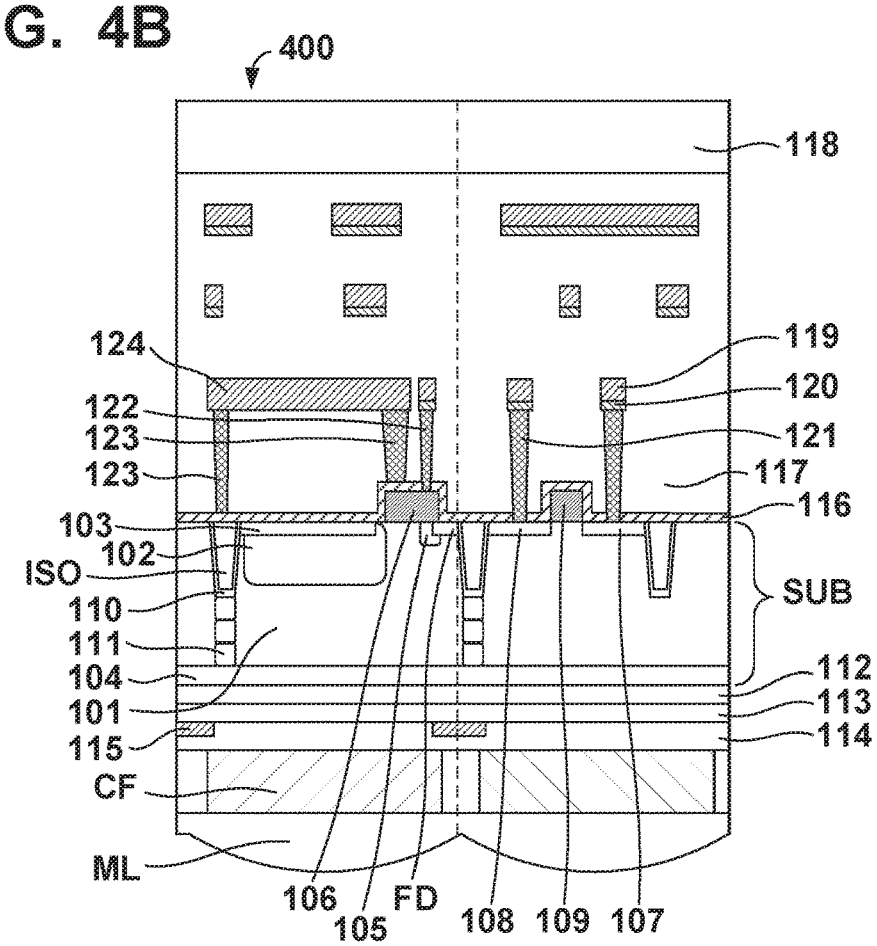

Next, as shown in FIG. 3B, the barrier metal 120 is deposited on the interlayer insulation film 117, the contact plugs 121 and 122, and the light-cutting portion 123, and the barrier metal 120 located in a position where the reflective layer 124 is to be formed is etched away. Then, as shown in FIG. 3C, a metal layer 301 is formed of aluminum or the like on the barrier metal 120 and on the region from which the barrier metal 120 has been removed. Next, in FIG. 3D, the wiring pattern 119 in the first layer and reflective layer 124 are formed by etching the metal layer 301 and the barrier metal 120. In this manner, the reflective layer 124 is formed through patterning in parallel with the process of patterning the wiring pattern 119, thus reducing the number of processes. Thereafter, the other constituent elements are formed using existing methods, and the image capturing apparatus 100 shown in FIGS. 1A and 1B is completed thus.

In the method for manufacturing the image capturing apparatus 100 described above, the interlayer insulation film 117 is etched using the insulating layer 116 as an etching stopper layer, and thus damage to the photoelectric conversion portion during the manufacture of the image capturing apparatus 100 can be reduced. The insulating layer 116 is a different layer than the gate insulation film. Alternatively, the insulating layer 116 contains a different material than the interlayer insulation film 117. Because the insulating layer 116, which is separate from the gate insulation film, is provided as the etching stopper layer, the image capturing apparatus 100 can be manufactured using a method that reduces damage to the photoelectric conversion portion. In the manufacturing method described above, a metal is embedded into the openings 202, 203, and 205 simultaneously in order to produce the contact plugs 121 and 122 and the light-cutting portion 123, respectively. This method embeds the metal in a single process, and thus the number of processes can be reduced. However, after producing the contact plugs 121 and 122 by embedding the metal in the openings 202 and 203 in the state shown in FIG. 2C, the process may then advance to the state shown in FIG. 2D, and the opening 205 may be formed. This method can further reduce damage to the semiconductor substrate SUB. In addition, in the image capturing apparatus 100, part of the light-cutting portion 123 is disposed on the transfer gate 106 and another part of the light-cutting portion 123 is disposed on the photoelectric conversion portion. According to this configuration, a mixture of colors caused by light passing through the vicinity of the transfer gate 106 can be reduced. In this configuration, damage to the photoelectric conversion portion can be further reduced by forming the insulating layer 116 so as to be a continuous layer spanning from above the photoelectric conversion portion to above the transfer gate 106.

Next, variations on the image capturing apparatus 100 shown in FIGS. 1A and 1B will be described with reference to FIGS. 4A to 7B. An image capturing apparatus 400 shown in FIGS. 4A and 4B differs from the image capturing apparatus 100 shown in FIGS. 1A and 1B in terms of the positional relationship between the photoelectric conversion portion and the light-cutting portion 123. The light-cutting portion 123 is disposed above the photoelectric conversion portion in the image capturing apparatus 100, as indicated by the solid line BD. This arrangement makes it possible to reduce the intervals between adjacent photoelectric conversion portions. On the other hand, part of the light-cutting portion 123 is disposed above the element isolation region ISO in the image capturing apparatus 400, as indicated by the solid line BD. This arrangement makes it possible to cut light that has passed through the photoelectric conversion portion across a wider range. The image capturing apparatus 400 can be manufactured by altering the method for manufacturing the image capturing apparatus 100 described above so as to change the position of the openings in the mask pattern 204 illustrated in FIG. 2D.

Figure 5A:
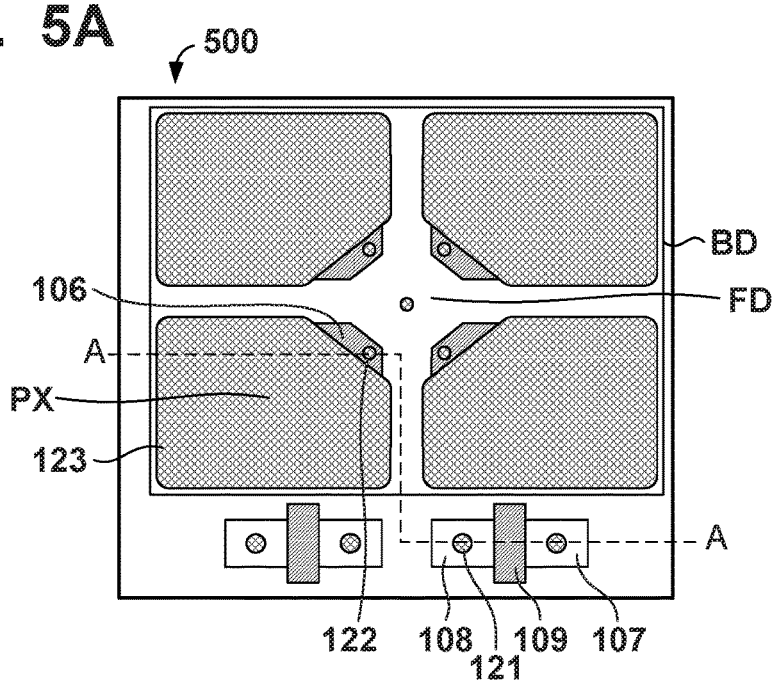
FIGS. 5A and 5B are diagrams illustrating a variation on the image capturing apparatus shown in FIGS. 1A and 1B.
Figure 5B:
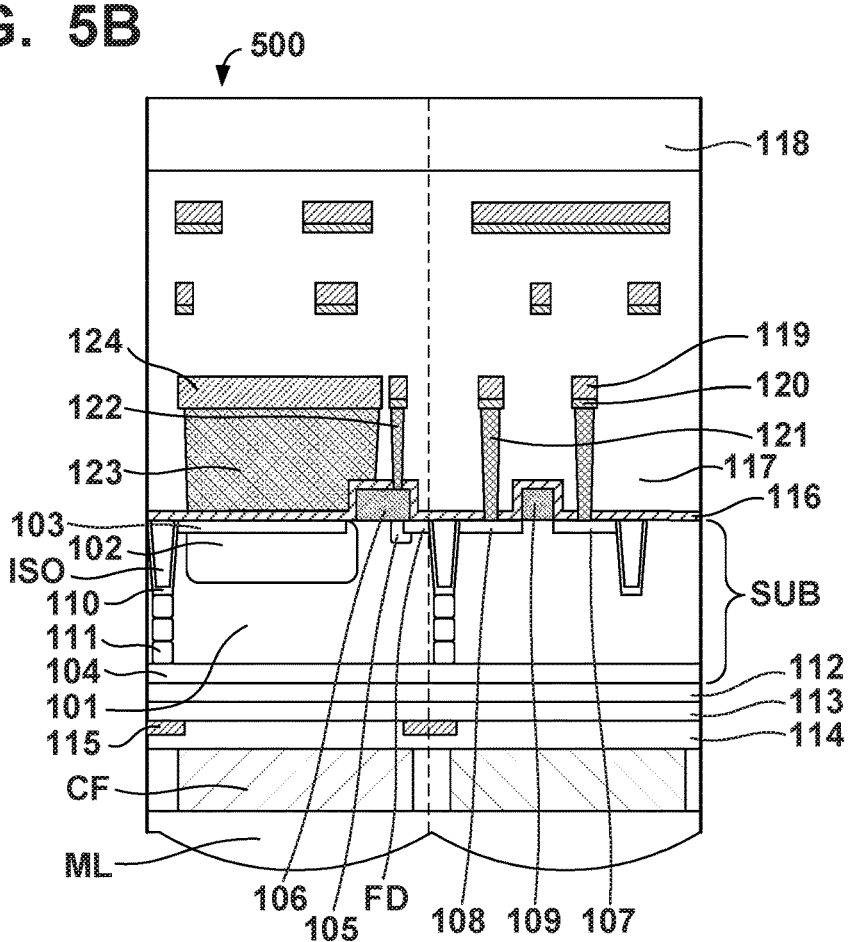

An image capturing apparatus 500 shown in FIGS. 5A and 5B differs from the image capturing apparatus 100 shown in FIGS. 1A and 1B in terms of the shape of the light-cutting portion 123. The light-cutting portion 123 of the image capturing apparatus 100 has a cylindrical shape extending away from the front surface FS of the semiconductor substrate SUB. On the other hand, the light-cutting portion 123 of the image capturing apparatus 500 has a pillar shape extending away from the front surface FS of the semiconductor substrate SUB. As a result of this shape, the light-cutting portion 123 also functions as a reflective layer, returning light that has passed through the photoelectric conversion portion back toward the photoelectric conversion portion by reflecting that light near the photoelectric conversion portion. It is not necessary for all of the light to be reflected by the light-cutting portion 123. The image capturing apparatus 500 can be manufactured by altering the method for manufacturing the image capturing apparatus 100 described above so as to change the shape of the openings in the mask pattern 204 illustrated in FIG. 2D. It is possible to combine the shape of the light-cutting portion 123 in the image capturing apparatus 500 with the configuration of the image capturing apparatus 400.

Figure 6A:
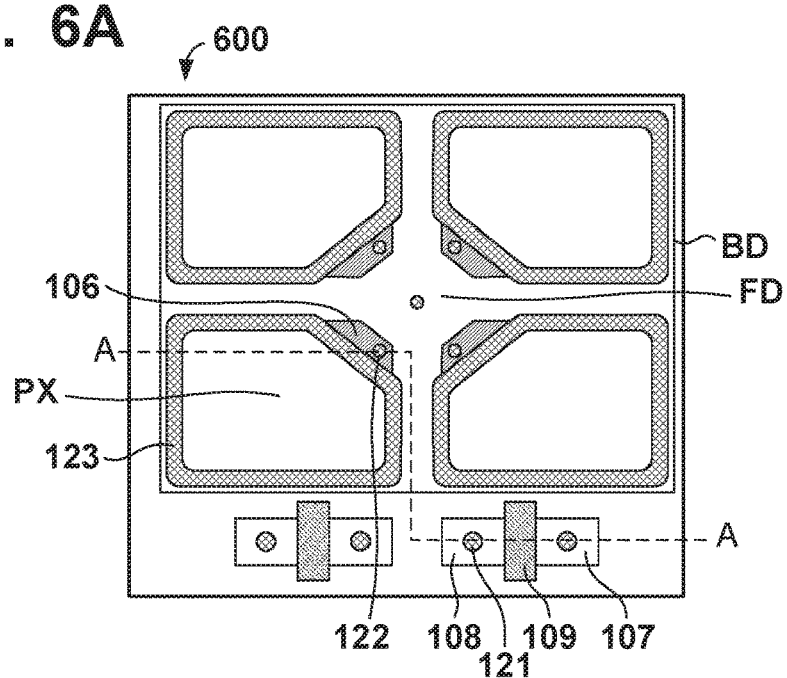
FIGS. 6A and 6B are diagrams illustrating a variation on the image capturing apparatus shown in FIGS. 1A and 1B.
Figure 6B:
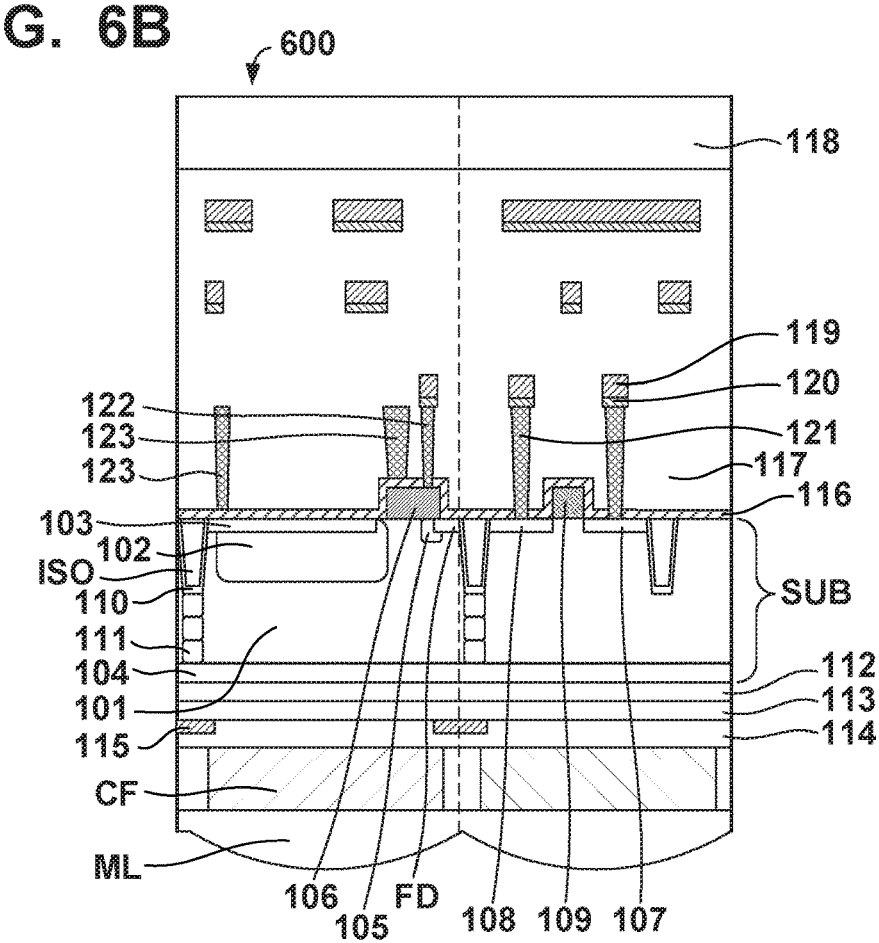

An image capturing apparatus 600 shown in FIGS. 6A and 6B differs from the image capturing apparatus 100 shown in FIGS. 1A and 1B in that the reflective layer 124 is not provided. By having the reflective layer 124, the image capturing apparatus 100 can return light that has passed through the photoelectric conversion portion back toward the photoelectric conversion portion, thus increasing the sensitivity of the photoelectric conversion portion. On the other hand, the image capturing apparatus 600 does not have a reflective layer in the first-layer wiring layer, thus increasing the freedom with which the wiring pattern 119 can be formed in the first-layer wiring layer. The image capturing apparatus 600 also includes the light-cutting portion 123, and thus the amount of light passing through the photoelectric conversion portion that reaches the photoelectric conversion portions of other pixels can be reduced. The image capturing apparatus 600 can be manufactured by altering the method for manufacturing the image capturing apparatus 100 described above so as to remove the reflective layer 124 by etching the metal layer 301 illustrated in FIG. 3D. The configuration of the image capturing apparatus 600, which does not have the reflective layer 124, can be combined with the configurations of either of the image capturing apparatuses 400 and 500.

Figure 7A:
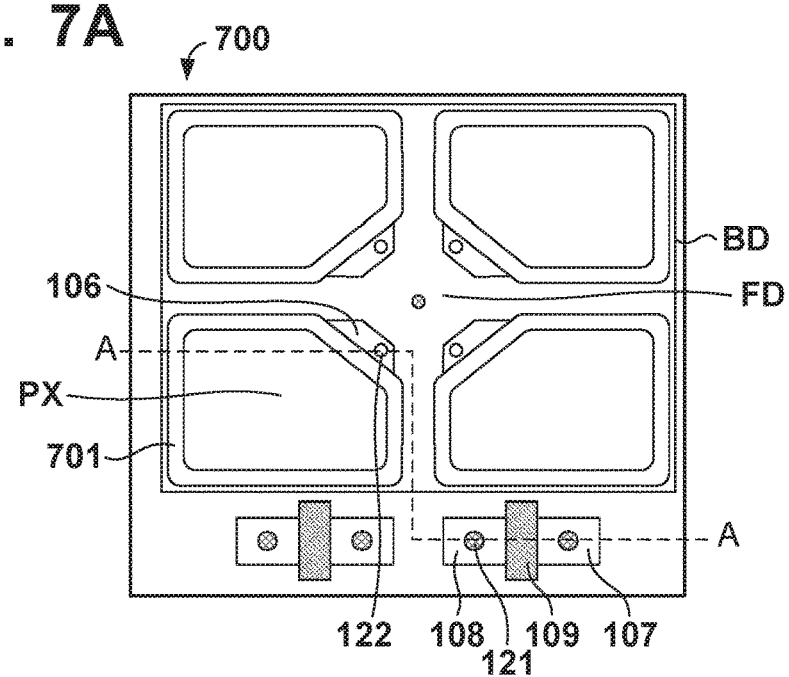
FIGS. 7A and 7B are diagrams illustrating a variation on the image capturing apparatus shown in FIGS. 1A and 1B.
Figure 7B:
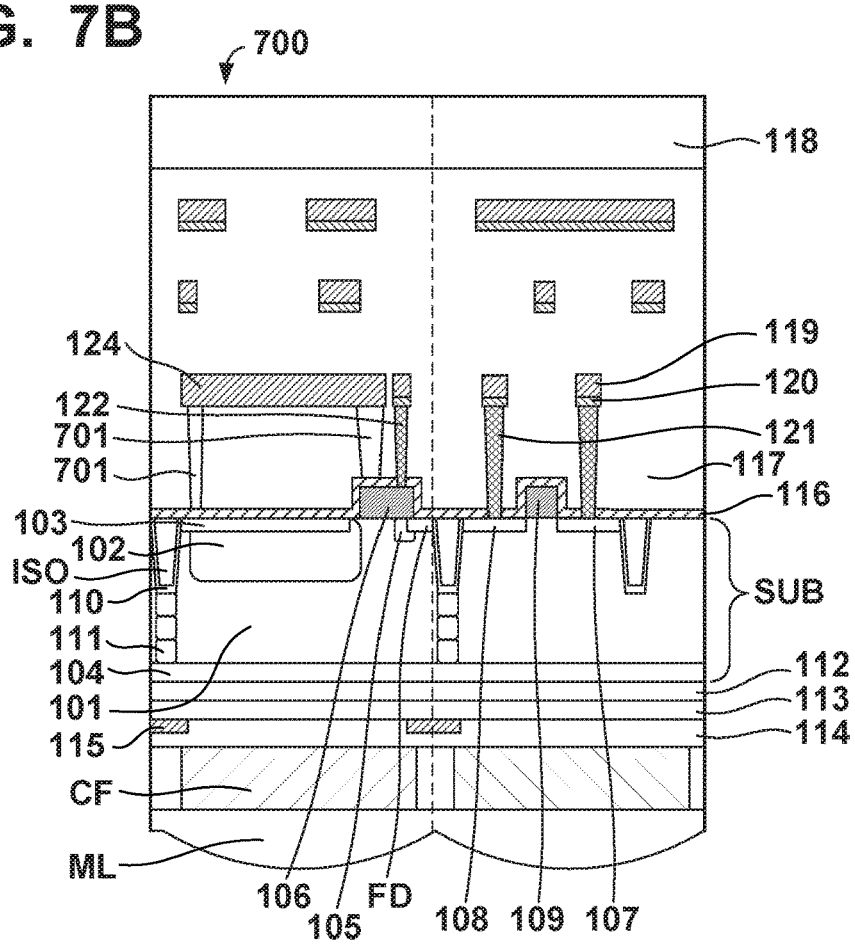

An image capturing apparatus 700 shown in FIGS. 7A and 7B differs from the image capturing apparatus 100 shown in FIGS. 1A and 1B in that a light-cutting portion 701 formed by an air gap is provided instead of the light-cutting portion 123 formed of a metal such as tungsten. The light-cutting portion 701 is also cylindrical in shape, and silicon oxide that forms the interlayer insulation film 117 is present on the inner side of the light-cutting portion 701. The refractive index of silicon oxide is higher than the refractive index of the air gap (atmospheric air, or a gaseous body in which a gas intermixes with the atmospheric air during manufacture), and thus light that advances to the inner side of the light-cutting portion 701 is reflected at the border between the light-cutting portion 701 and the interlayer insulation film 117. Accordingly, in this variation, there is no particular limit on the relationship between the transmissibility of the light-cutting portion 701 and the transmissibility of the interlayer insulation film 117. The image capturing apparatus 700 can be manufactured by altering the method for manufacturing the image capturing apparatus 100 described above so that a metal such as tungsten is not embedded in the opening 205 shown in FIG. 3A, leaving the opening as-is. The light-cutting portion 701 of the image capturing apparatus 700 can be combined with the configurations of either of the image capturing apparatuses 400 and 500.

Figure 8A:
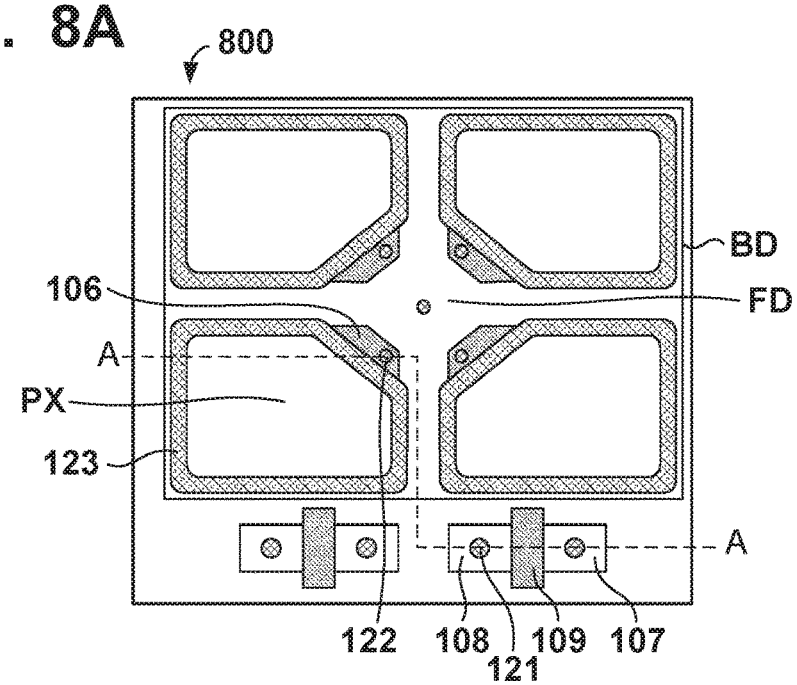
FIGS. 8A and 8B are diagrams illustrating an example of the structure of an image capturing apparatus according to some other embodiments.
Figure 8B:
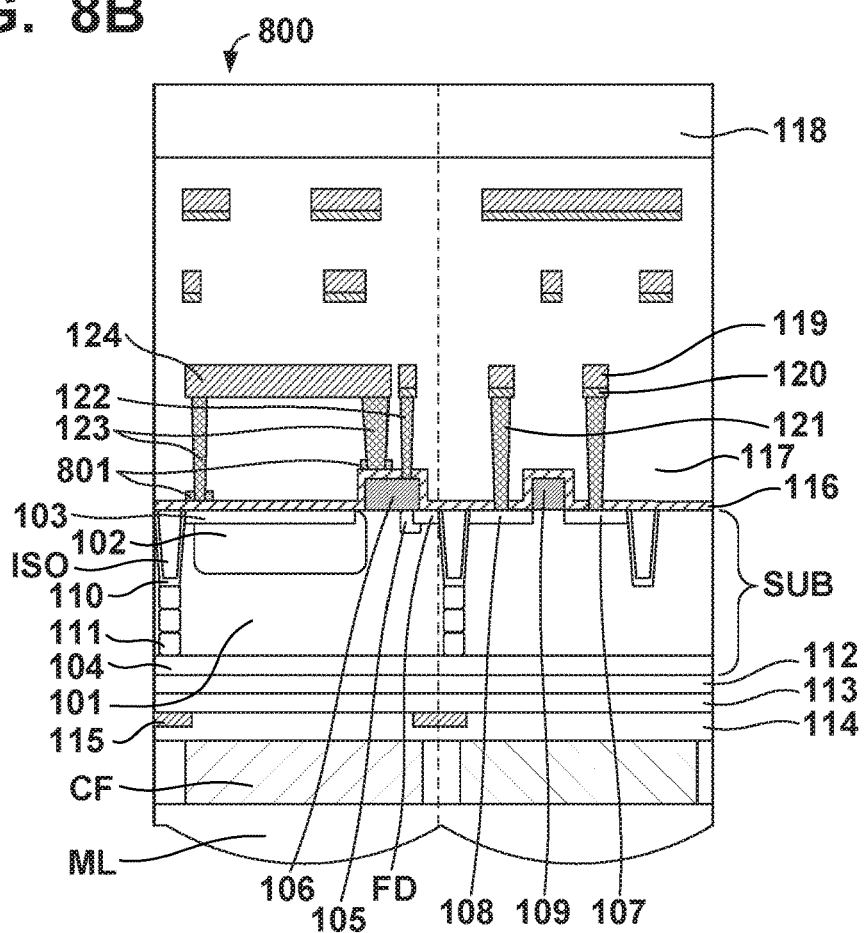

Next, the structure of an image capturing apparatus 800 according to some other embodiments will be described with reference to FIGS. 8A and 8B. FIG. 8A is a plan view illustrating part of the image capturing apparatus 800, whereas FIG. 8B illustrates a cross-sectional view taken along the A-A line in FIG. 8A. Some constituent elements have been omitted from the plan view in FIG. 8A in order to make the illustrations clearer. The image capturing apparatus 800 differs from the image capturing apparatus 100 shown in FIGS. 1A and 1B in that an insulating layer 801 (a second insulating layer) that functions as an etching stopper layer is further provided. Descriptions of content already described in the aforementioned embodiment will therefore not be repeated. The insulating layer 801 is disposed in a position where the light-cutting portion 123 is to be formed, and is not disposed in positions where the contact plugs 121 and 122 are to be formed.

Figure 9A:
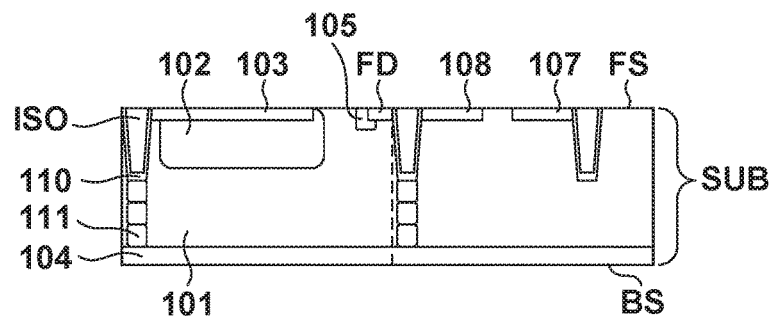
FIGS. 9A to 9D are diagrams illustrating an example of a method for manufacturing the image capturing apparatus shown in FIGS. 8A and 8B.
Figure 9B:
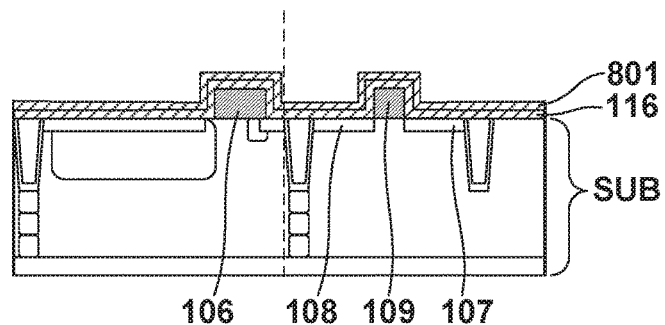

An example of a method for manufacturing the image capturing apparatus 800 shown in FIGS. 8A and 8B will now be described with reference to FIGS. 9A to 9D. FIGS. 9A to 9D are cross-sectional views from the same position as in FIG. 8B. First, the semiconductor substrate SUB indicated in FIG. 9A is prepared, in the same manner as the step of the manufacturing method illustrated in FIG. 2A. Next, as shown in FIG. 9B, the transfer gate 106, the gate 109, and the insulating layer 116 are formed, in the same manner as the step of the manufacturing method illustrated in FIG. 2B. Thereafter, the insulating layer 801 is deposited on the insulating layer 116 through plasma CVD. The insulating layer 801 can have a layered structure including, for example, a silicon nitride film and a silicon oxide film serving as layers.

Figure 9C:
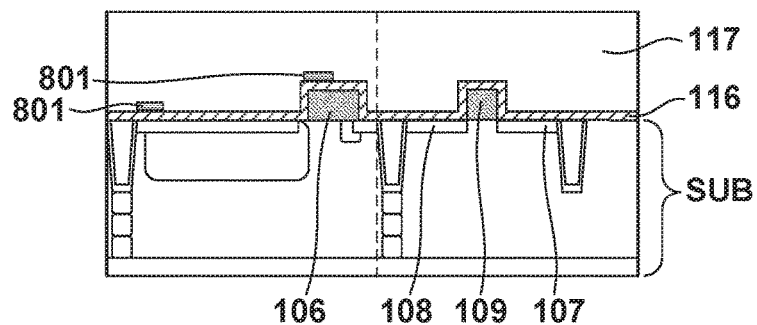

Next, as shown in FIG. 9C, part of the insulating layer 801 is removed so that the insulating layer 801 remains in the position where the light-cutting portion 123 is to be formed but does not remain in the positions where the contact plugs 121 and 122 are to be formed. Thereafter, the interlayer insulation film 117 is formed by depositing silicon oxide on the insulating layers 116 and 801 through plasma CVD, and the upper surface of the interlayer insulation film 117 is then planarized through CMP.

Figure 9D:
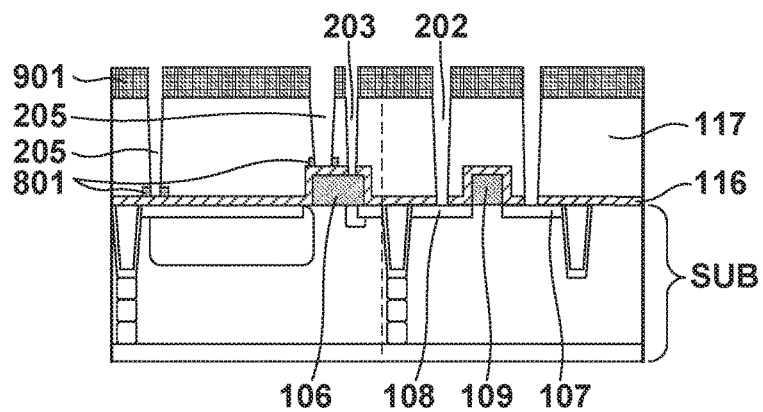

Next, as shown in FIG. 9D, a mask pattern 901 is formed on the interlayer insulation film 117 so as to expose positions where the contact plugs 121 and 122 and the light-cutting portion 123 are to be formed and cover the other parts of the interlayer insulation film 117. Etching is then carried out over the mask pattern 901, removing part of the interlayer insulation film 117 as a result. This etching uses an etchant gas for removing the silicon oxide that configures the interlayer insulation film 117. This etching is stopped by the silicon nitride film contained in the insulating layer 116 at the positions where the contact plugs 121 and 122 are to be formed. In other words, the insulating layer 116 functions as an etching stopper layer at these positions. The etching is also stopped by the silicon nitride film contained in the insulating layer 801 at the position where the light-cutting portion 123 is to be formed. In other words, the insulating layer 801 functions as an etching stopper layer at these positions.

After this, etching is carried out over the same mask pattern 901, removing part of the silicon nitride film contained in the insulating layers 801 and 116 as a result. Through this, the openings 202 and 203 that expose the semiconductor region 108 and the transfer gate 106 are formed at the positions where the contact plugs 121 and 122 are to be formed. On the other hand, the etching is stopped by the silicon oxide film contained in the insulating layer 116 at the position where the light-cutting portion 123 is to be formed. Accordingly, the insulating layer 116 functions as an etching stopper layer at the position where the light-cutting portion 123 is to be formed, and thus damage to the photoelectric conversion portion caused by the etching is reduced. The steps that follow thereafter are the same as the steps described with reference to FIG. 3A and on, and thus redundant descriptions thereof will be omitted.

The image capturing apparatus 800 can achieve the same effects as those described with reference to the image capturing apparatus 100. Furthermore, the various variations on the aforementioned image capturing apparatus 100 can be applied to the image capturing apparatus 800 as well.

Figure 10A:
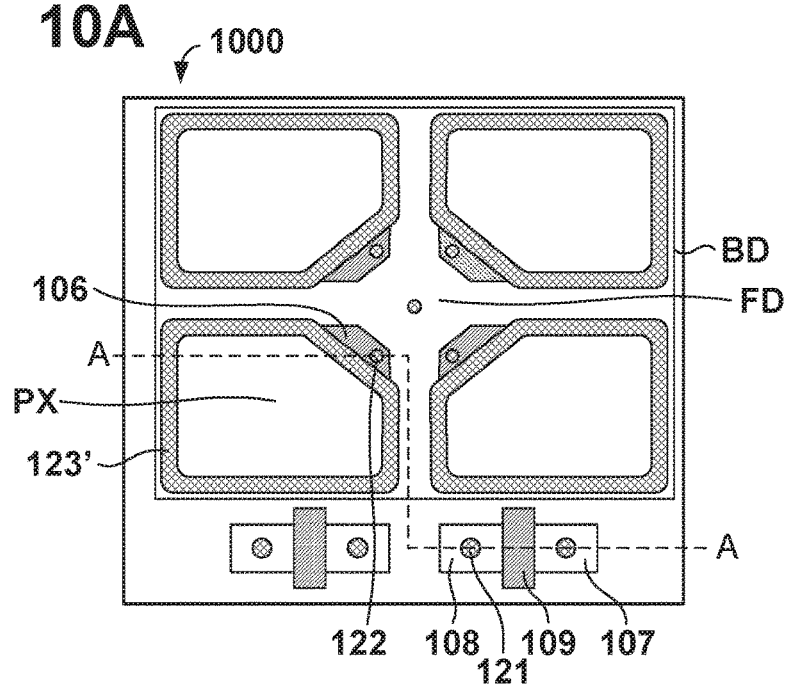
FIGS. 10A and 10B are diagrams illustrating an example of the structure of an image capturing apparatus according to some other embodiments.
Figure 10B:
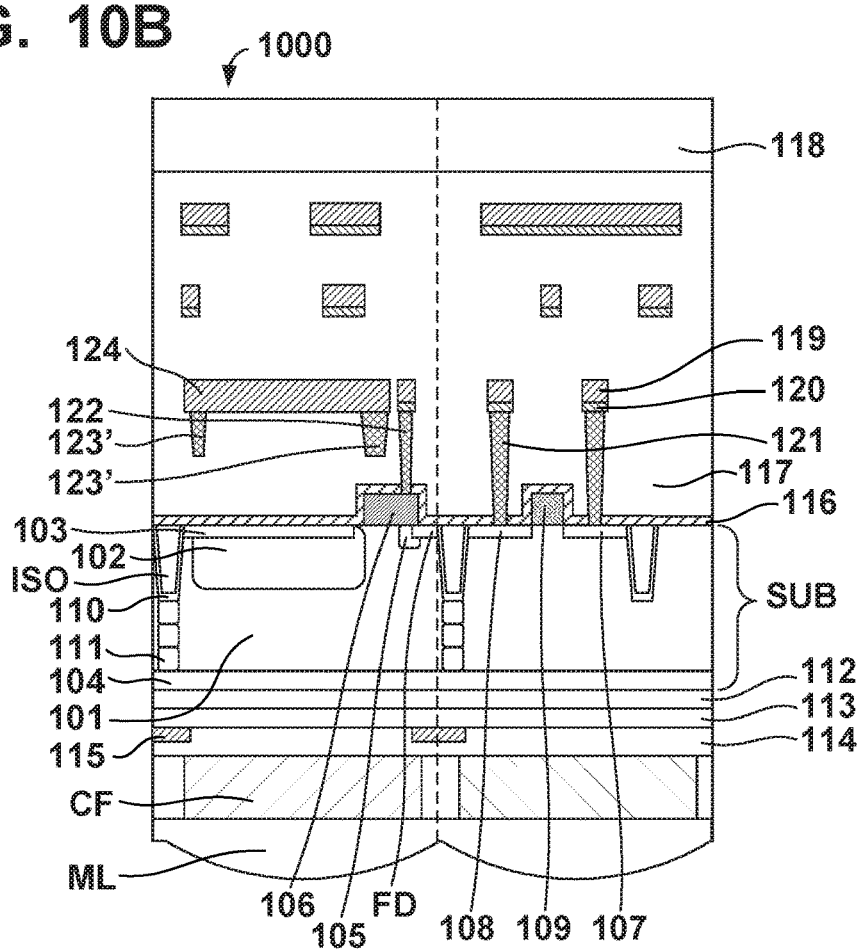

The structure of an image capturing apparatus 1000 according to some other embodiments will now be described with reference to FIGS. 10A and 10B. FIG. 10A is a plan view illustrating part of the image capturing apparatus 1000, whereas FIG. 10B illustrates a cross-sectional view taken along the A-A line in FIG. 10A. Some constituent elements have been omitted from the plan view in FIG. 10A in order to make the illustrations clearer. As indicated in FIG. 10B, the image capturing apparatus 1000 is a back-side illumination image capturing apparatus 1000, and the image capturing apparatus 1000 can receive incident light from below, in the depiction in FIG. 10B, and convert that light into a signal. However, some embodiments are not limited to the configuration of the image capturing apparatus shown in FIGS. 10A and 10B, and can be applied in any configuration as long as the image capturing apparatus is a back-side illumination type. The image capturing apparatus 1000 differs from the image capturing apparatus 100 in that a light-cutting portion 123' is provided instead of the light-cutting portion 123. The other configurations may be the same and thus redundant descriptions will be omitted. The light-cutting portion 123' does not pass through the interlayer insulation film 117, and thus does not reach the insulating layer 116 located below the interlayer insulation film 117.

Figure 11A:
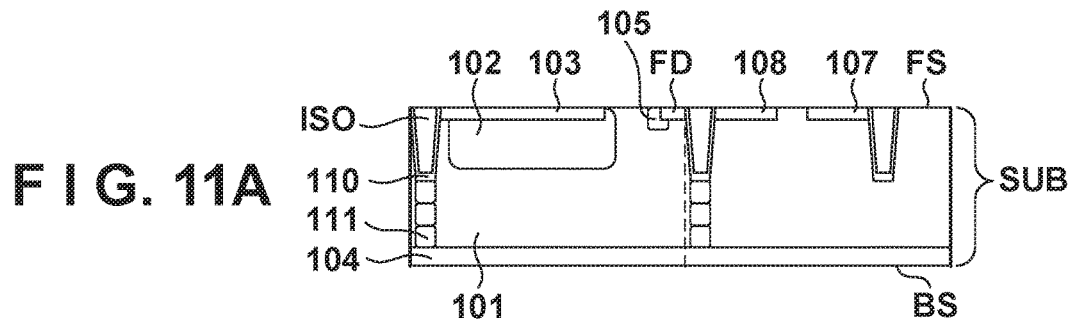
Figure 11B:
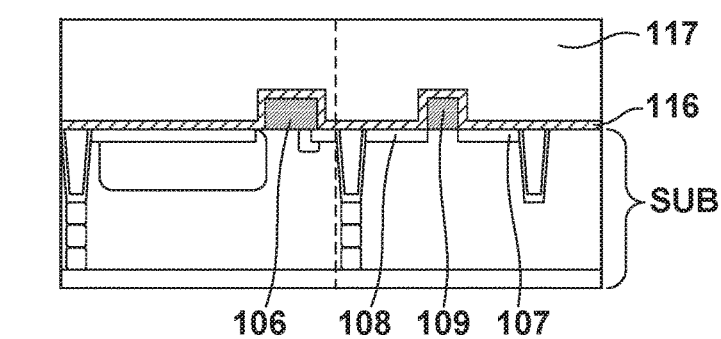
Figure 11C:
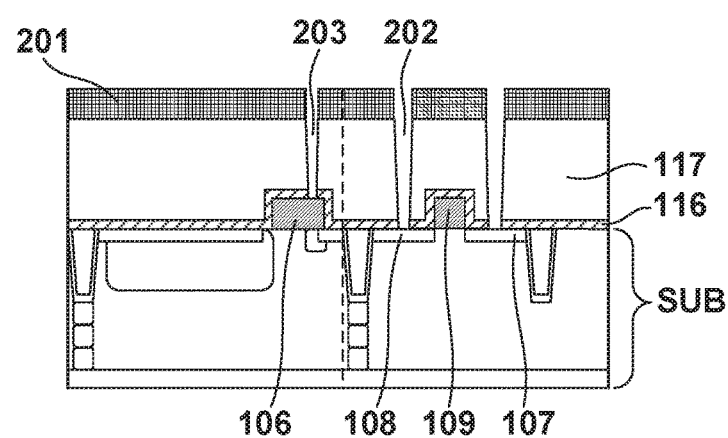

An example of a method for manufacturing the image capturing apparatus 1000 shown in FIGS. 10A and 10B will now be described with reference to FIGS. 11A to 11D and 12A to 12D. FIGS. 11A to 11D and 12A to 12D are cross-sectional views from the same position as in FIG. 10B. The steps shown in FIGS. 11A to 11C are the same as the steps shown in FIGS. 2A to 2C, and thus redundant descriptions thereof will be omitted.

Figure 11D:
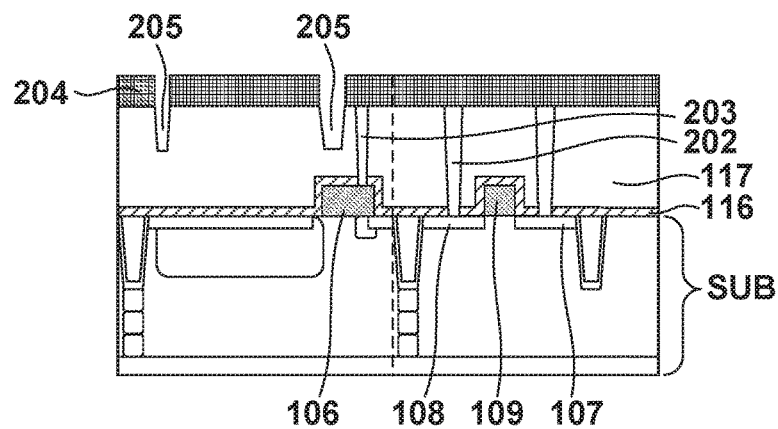

Next, as shown in FIG. 11D, the mask pattern 201 is removed, and the mask pattern 204 is formed on the interlayer insulation film 117. The mask pattern 204 exposes positions where the light-cutting portion 123' shown in FIGS. 10A and 10B is to be formed, and covers the other areas. Etching is then carried out over the mask pattern 204, forming the opening 205 by removing part of the interlayer insulation film 117. The etching time is adjusted based on data obtained in advance through simulations, experimentation, or the like so that the opening 205 (the second opening) does not reach the insulating layer 116 during this etching. The etching is stopped before the opening 205 passes through the interlayer insulation film 117 by carrying out the etching only for the adjusted time. In this manner, the formation of the openings 202 and 203 for the contact plugs and the formation of the opening 205 for the light-cutting portion are carried out through separate etching operations having mutually different etching times. Alternatively, in the case where the etching is carried out for the same amount of time, the etching conditions may be altered so that the etching rate changes. For example, in the case where dry etching such as reactive ion etching (RIE) is performed, the etching rate can be altered by changing the plasma energy.

The steps shown in FIGS. 12A to 12D are the same as the steps shown in FIGS. 3A to 3D, and thus redundant descriptions thereof will be omitted. However, the light-cutting portion 123' is formed in these steps instead of the light-cutting portion 123.

According to the method for manufacturing the image capturing apparatus 1000 described above, etching for forming the opening used to form the light-cutting portion 123' is carried out so that the opening does not pass through the interlayer insulation film 117, and thus damage to the photoelectric conversion portion while manufacturing the image capturing apparatus 1000 can be reduced. In the manufacturing method described above, a metal is embedded into the openings 202, 203, and 205 simultaneously in order to produce the contact plugs 121 and 122 and the light-cutting portion 123', respectively. This method embeds the metal in a single process, and thus the number of processes can be reduced. However, after producing the contact plugs 121 and 122 by embedding the metal in the openings 202 and 203 in the state shown in FIG. 11C, the process may then advance to the state shown in FIG. 11D, and the opening 205 may then be formed. This method can further reduce damage to the semiconductor substrate SUB. Furthermore, the various variations on the aforementioned image capturing apparatus 100 can be applied to the image capturing apparatus 1000 as well.

Figure 13A:
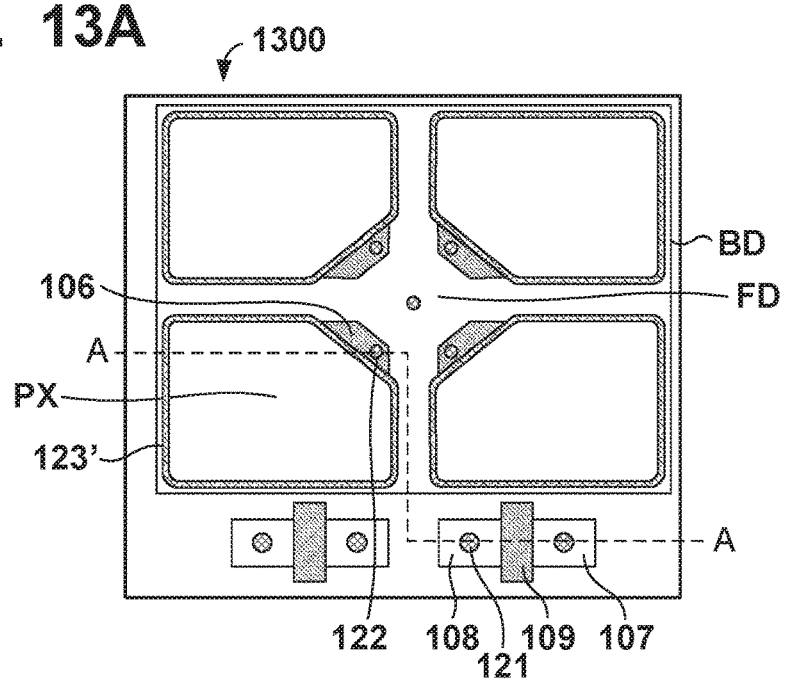
FIGS. 13A and 13B are diagrams illustrating an example of the structure of an image capturing apparatus according to some other embodiments.
Figure 13B:
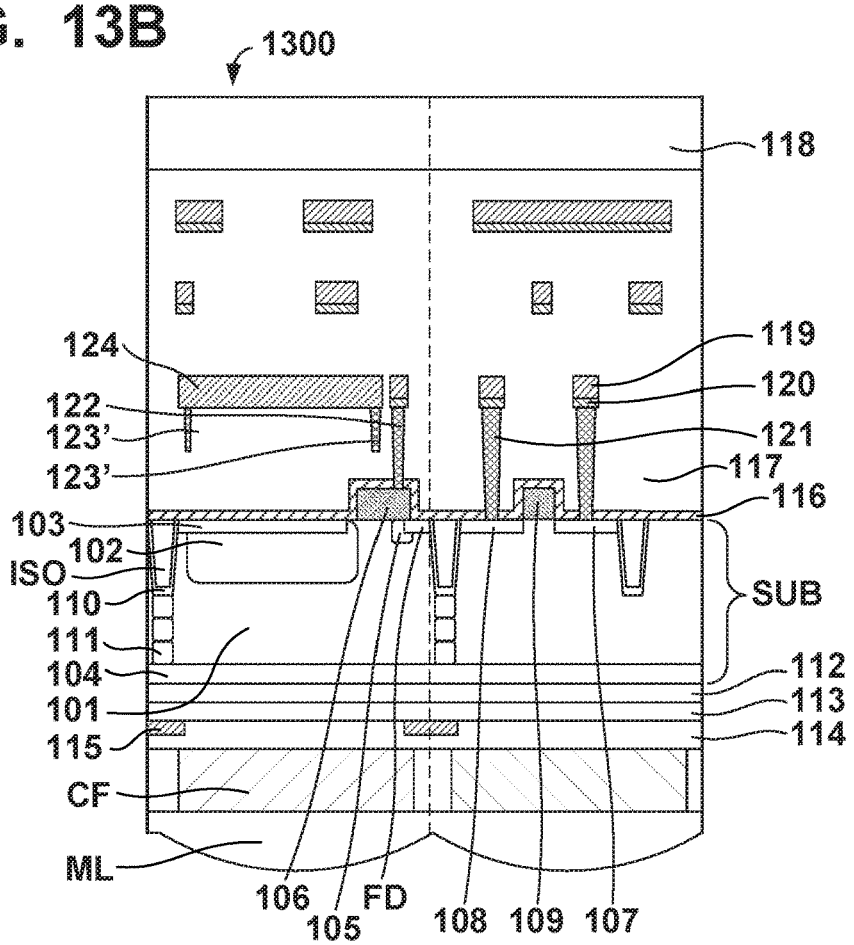

Next, the structure of an image capturing apparatus 1300 according to some other embodiments will be described with reference to FIGS. 13A and 13B. FIG. 13A is a plan view illustrating part of the image capturing apparatus 1300, whereas FIG. 13B illustrates a cross-sectional view taken along the A-A line in FIG. 13A. Some constituent elements have been omitted from the plan view in FIG. 13A in order to make the illustrations clearer. The image capturing apparatus 1300 differs from the image capturing apparatus 1000 shown in FIG. 10 in that the light-cutting portion 123' is narrower than the contact plugs 121 and 122. Accordingly, redundant descriptions will not be repeated.

Figure 14:
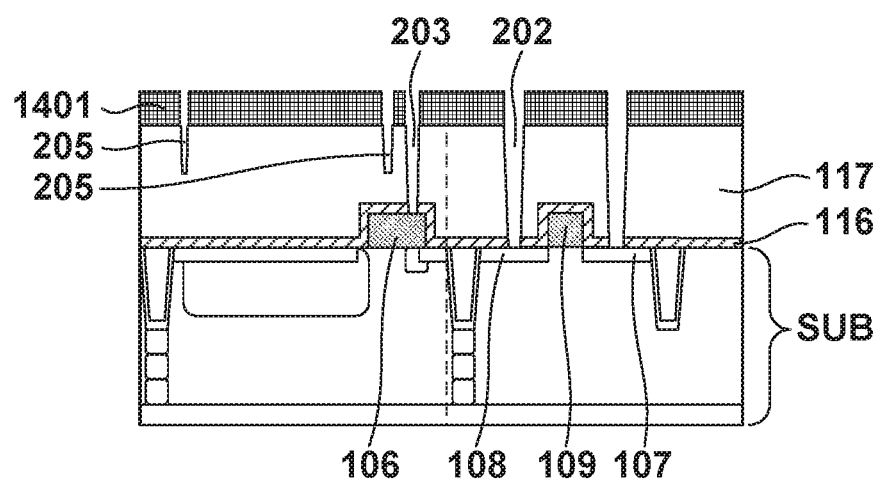
FIG. 14 is a diagram illustrating an example of a method for manufacturing the image capturing apparatus shown in FIGS. 13A and 13B.

An example of a method for manufacturing the image capturing apparatus 1300 shown in FIGS. 13A and 13B will now be described with reference to FIG. 14. FIG. 14 is a cross-sectional view from the same position as in FIG. 13B. First, the structure illustrated in FIG. 2B is prepared using the same manufacturing method as described above. Next, as shown in FIG. 14, a mask pattern 1401 is formed on the interlayer insulation film 117 so as to expose positions where the contact plugs 121 and 122 and the light-cutting portion 123' are to be formed and cover the other parts of the interlayer insulation film 117. The opening in the mask pattern 1401 that exposes the position where the light-cutting portion 123' is to be formed is narrower than the openings in the mask pattern 1401 that expose the positions where the contact plugs 121 and 122 are to be formed. Etching is then carried out over the mask pattern 1401, removing part of the interlayer insulation film 117 as a result. During this etching, the etching rate is lower the narrower the openings in the mask pattern 1401 are, and thus the opening 205 does not pass through the interlayer insulation film 117 even if the openings 202 and 203 reach the semiconductor region 108, the transfer gate 106, and the like as a result of the etching. The steps that follow thereafter are the same as the steps described with reference to FIG. 3A and on, and thus redundant descriptions thereof will be omitted.

The image capturing apparatus 1300 can achieve the same effects as those described with reference to the image capturing apparatus 1000. Furthermore, the various variations on the aforementioned image capturing apparatus 100 can be applied to the image capturing apparatus 1300 as well. For example, in the case where a pillar-shaped light-cutting portion is employed as in the image capturing apparatus 500 shown in FIGS. 5A and 5B, a plurality of long, narrow pillar-shaped light-cutting portions may be formed in order to accommodate a reduced width in the mask pattern.

Next, an example of a camera that incorporates the image capturing apparatuses according to the aforementioned embodiments will be described as a working example of the image capturing apparatuses. The concept of a camera includes not only a device whose primary function is capturing images, but also a device that has an auxiliary image capturing function (for example, personal computers, mobile terminals, and so on). The camera includes the image capturing apparatus according to the present invention as described in the aforementioned embodiments, and a signal processing unit that processes signals outputted from the image capturing apparatus. This signal processing unit can include, for example, an A/D converter and a processor that processes digital data outputted from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-233301 filed Oct. 22, 2012 and 2012-233300 filed Oct. 22, 2012, which are hereby incorporated by reference herein in their entirety.

What is claimed is:

1. A back-side illumination image capturing apparatus comprising:
   a semiconductor substrate having a first surface for receiving incident light and a second surface located on the opposite side as the first surface, and including a photoelectric conversion portion, and a gate electrode disposed above the second surface;
   an insulating film disposed above the second surface of the semiconductor substrate;
   a contact plug connected to a wiring arranged in a first layer and the gate electrode; and
   a light-cutting portion for cutting light, of the incident light, that has passed through the photoelectric conversion portion, the light-cutting portion including a first end portion and a second end portion and extending from the first end portion to the second end portion, a direction from the first end portion to the second end portion being along a direction from the first layer to the second surface,
   wherein at least part of the insulating film is located between the light-cutting portion and the semiconductor substrate in a direction perpendicular to the second surface, and
   a distance between the second end portion of the light-cutting portion and the second surface of the semiconductor substrate is greater than a distance between the gate electrode and the second surface of the semiconductor substrate and less than a distance between the wiring and the second surface of the semiconductor substrate.

2. The image capturing apparatus according to claim 1, wherein part of the light-cutting portion is located over the gate electrode, and
   the insulating film is located between the part of the light-cutting portion and the gate electrode.

3. The image capturing apparatus according to claim 1, wherein the insulating film contains a different material than a gate insulation film under the gate electrode.

4. The image capturing apparatus according to claim 1, wherein the light-cutting portion reflects the light that has passed through the photoelectric conversion portion.

5. A camera comprising:
 a back-side illumination image capturing apparatus according to claim 1; and
 a signal processing unit that processes a signal from the image capturing apparatus.

6. The image capturing apparatus according to claim 1, wherein the insulating film is an interlayer insulation film.

7. The image capturing apparatus according to claim 1, wherein the semiconductor substrate further includes an element isolation region in the periphery of the photoelectric conversion portion, and
 at least part of the light-cutting portion is located over the element isolation region.

8. The image capturing apparatus according to claim 1, wherein the light-cutting portion is a metal layer embedded in an opening.

9. The image capturing apparatus according to claim 1, wherein the light-cutting portion is an air gap formed in an opening.

10. The image capturing apparatus according to claim 1, further comprising:
 a reflective layer arranged in a position covering the light-cutting portion.

11. The image capturing apparatus according to claim 10, wherein the reflective layer is a part of a wiring pattern connected to the contact plug.

12. The image capturing apparatus according to claim 1, wherein the light-cutting portion has a cylindrical shape extending away from the second surface of the semiconductor substrate.

13. The image capturing apparatus according to claim 1, wherein the light-cutting portion has a pillar shape extending away from the second surface of the semiconductor substrate.

14. The image capturing apparatus according to claim 1, wherein the insulating film is a first insulating layer,
 the apparatus further comprises an interlayer insulation film disposed on the first insulating layer, and
 the light-cutting portion passes through at least part of the interlayer insulation film.

15. The image capturing apparatus according to claim 14, further comprising:
 a second insulating layer, disposed between the first insulating layer and the interlayer insulation film, through which the light-cutting portion passes.

16. The image capturing apparatus according to claim 15, wherein the first insulating layer and the second insulating layer each have a layered structure including a silicon oxide film and a silicon nitride film as layers.

17. The image capturing apparatus according to claim 1, wherein the insulating film is a continuous layer spanning from above the photoelectric conversion portion to side and top surfaces of the gate electrode.

* * * * *